(12) United States Patent
Cho

(10) Patent No.: US 7,163,884 B2
(45) Date of Patent: Jan. 16, 2007

(54) SEMICONDUCTOR DEVICE AND FABRICATION METHOD THEREOF

(75) Inventor: Gyung-Su Cho, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 33 days.

(21) Appl. No.: 11/020,327

(22) Filed: Dec. 22, 2004

(65) Prior Publication Data

US 2005/0136645 A1     Jun. 23, 2005

Related U.S. Application Data

(62) Division of application No. 10/676,645, filed on Oct. 1, 2003.

(30) Foreign Application Priority Data

Oct. 2, 2002     (KR)     ............ 10-2002-0060303

(51) Int. Cl.
*H01L 21/44*     (2006.01)
(52) U.S. Cl. .............. 438/612; 438/614; 438/688; 438/615; 438/652; 257/E21.002
(58) Field of Classification Search ............ 438/612, 438/614, 688, 615, 652
See application file for complete search history.

(56) References Cited

U.S. PATENT DOCUMENTS

| | | | |
|---|---|---|---|
| 5,563,099 A | 10/1996 | Grass | |
| 5,571,752 A * | 11/1996 | Chen et al. | 438/642 |
| 6,077,775 A | 6/2000 | Stumberg et al. | |
| 6,239,494 B1 | 5/2001 | Besser et al. | |
| 6,376,353 B1 | 4/2002 | Zhou et al. | |
| 6,400,026 B1 | 6/2002 | Andou et al. | |
| 6,468,906 B1 * | 10/2002 | Chan et al. | 438/687 |
| 6,551,856 B1 | 4/2003 | Lee | |
| 6,620,721 B1 * | 9/2003 | Lee | 438/612 |
| 6,638,867 B1 | 10/2003 | Liu et al. | |
| 6,710,460 B1 * | 3/2004 | Morozumi | 257/779 |
| 2002/0024142 A1 | 2/2002 | Sekiguchi | |
| 2003/0194877 A1 * | 10/2003 | Yau et al. | 438/745 |

FOREIGN PATENT DOCUMENTS

KR     1020010036333 A     5/2001

OTHER PUBLICATIONS

Wolf, S. and Tauber, R.N., "Silicon Processing for the VLSI Era", vol. 1, pp. 559-564, 1986.*

* cited by examiner

Primary Examiner—Zandra V. Smith
Assistant Examiner—Christy Novacek
(74) Attorney, Agent, or Firm—Andrew D. Fortnay

(57) ABSTRACT

A bonding pad of a semiconductor device and a fabrication method thereof are disclosed. A semiconductor device having a pad formed by exposing a predetermined region of a metal line formed over a semiconductor substrate includes an alloy layer formed on the metal line exposed through the pad. The alloy layer is formed from a reaction between the metal line and a metal having a melting point less than or equal to 1000° C.

20 Claims, 2 Drawing Sheets

SEMICONDUCTOR DEVICE AND FABRICATION METHOD THEREOF

RELATED APPLICATIONS

This application is a Divisional of U.S. application Ser. No. 10/676,645 filed Oct. 1, 2003, which claims the benefit of the filing date of Korean Application No. 10-2002-0060303, filed Oct. 2, 2002.

FIELD OF THE DISCLOSURE

The present disclosure relates to a semiconductor device. More particularly, the present disclosure relates to a bonding pad of a semiconductor device and a fabrication method thereof.

BACKGROUND

A bonding pad acts as a terminal for interconnecting a semiconductor device and a package. That is, following packaging of a pad, which exposes a predetermined portion of a metal line of an uppermost layer of the semiconductor device, connection is made to a region used for connection to a pin. Through such a bonding process, the semiconductor device is electrically connected to an external device such as a power supply assembly.

So that good bonding is realized, no foreign substances may be present nor can an oxidation layer be formed on a surface of a metal thin layer that forms the bonding pad. However, in conventional devices, the surface of the metal line becomes oxidized or a refractory metal is left remaining thereon. In either of these two cases, bonding is not performed in a satisfactory manner, a bonding line becomes unaligned, and other similar problems may occur.

If copper is used for the metal line, the copper may be easily corroded or oxidized thereby preventing bonding from being fully performed when the copper line is exposed to air. Even with the advantages of copper, particularly its ability to increase the driving speed of the device as a result of its low resistance, copper cannot typically be used for the uppermost metal line because of this drawback. In a case where copper is used despite this problem, a high bonding defect rate often results.

DETAILED DESCRIPTION

Figure 1A:
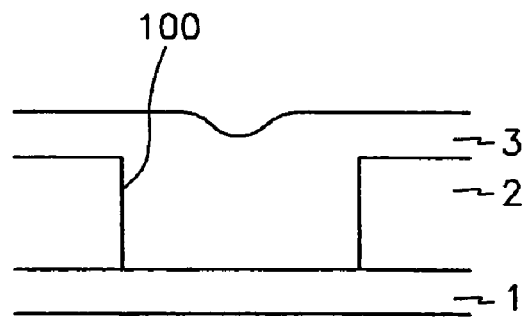
FIGS. 1a through 1f are partial sectional views that depict an example method for fabricating a semiconductor device.

In one example embodiment, a semiconductor device in which a bonding pad thereof is formed so that no bonding defects result even with the use of copper for a metal line of an uppermost layer. In the example embodiment, the semiconductor device includes, in a structure realizing a pad by exposing a predetermined region of a metal line formed on a semiconductor substrate, an alloy layer formed the metal line exposed through the pad. The alloy layer is formed by a reaction between the metal line and a metal having a melting point of 1000° C. or less. The metal line is preferably made of copper. Also, the metal having a melting point of 1000° C. or less may be aluminum, lead, or silver. Preferably, the thickness of the alloy layer is less than a thickness of the metal line. A protection layer made of silicon nitride or silicon oxynitride is preferably formed over the metal line, except where the pad is formed. Preferably, a barrier metal layer made from a metal such as Ti, Ta, TiN, or TaN is formed along inner walls of a via to prevent the permeation of the metal line into an adjacent element. The barrier metal layer may be formed to a thickness between 200 Å and 800 Å. A width of the pad is preferably less than a width of the via.

In another example embodiment, in a structure of a semiconductor device in which a via is formed by etching a predetermined region of an insulation layer on a semiconductor substrate and the via is filled with a metal for forming a metal line, a method for fabricating the semiconductor device includes forming a reaction layer on an outermost surface of the metal line and the insulation layer. The reaction layer has a melting point of 1000° C. or less. Also, a heat-treating process is performed to react the reaction layer and the metal line, thereby forming an alloy layer in contacting surfaces of the reaction layer and the metal line. Chemical mechanical polishing is performed until the insulation layer is exposed such that the alloy layer is left remaining only within the via. Finally, a protection layer is formed on the insulation layer and the alloy layer, and etching a predetermined region of the protection layer to form a pad that exposes a predetermined region of the alloy layer is performed.

The reaction layer is made of a material such as aluminum, lead, and silver, and a physical vapor deposition process that includes sputtering is preferably used to form the reaction layer at a temperature of 300° C. or less. Preferably, the reaction layer is deposited to a thickness that is less than a thickness of the metal line. The heat-treating process is preferably performed at a temperature of 350~450° C. and for a duration of 10 to 60 minutes. Preferably, the copper line is formed on a barrier metal layer after forming the barrier metal layer from a metal selected from the group consisting of Ti, Ta, TiN, or TaN along inner walls of the via to prevent the permeation of the metal line into an adjacent element, and the barrier metal layer is formed to a thickness between 200 Å and 800 Å. The copper wiring is then formed on the barrier metal layer. Preferably, a cleaning process is performed following chemical mechanical polishing, and following the cleaning process, a heat-treating process is performed at a temperature of 250~350° C. for a duration of 10 to 60 minutes.

Figure 1B:
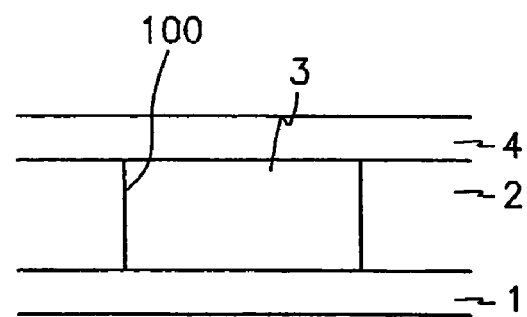
Figure 1C:
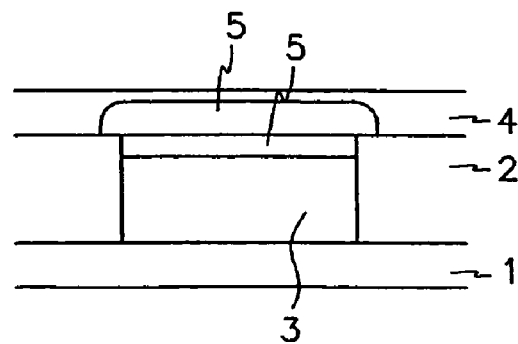
Figure 1D:
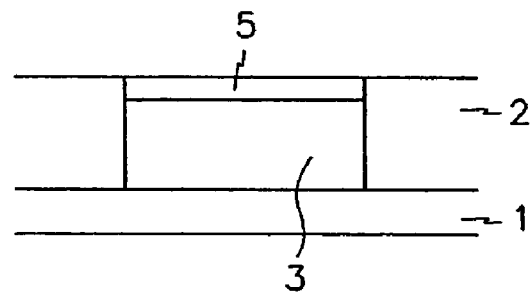
Figure 1E:
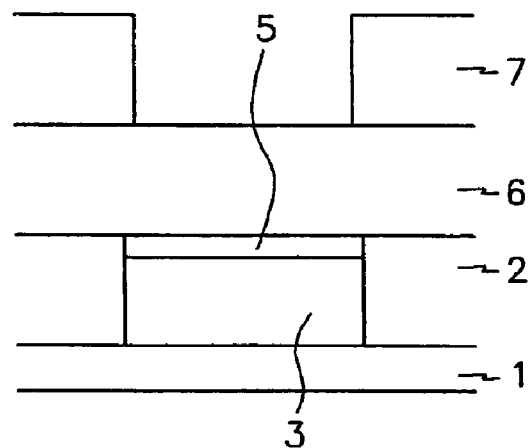
Figure 1F:
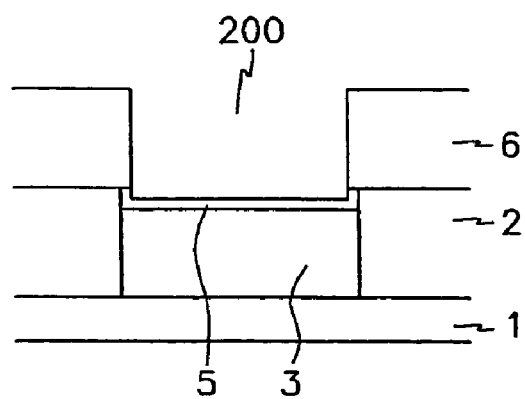

With reference to FIG. 1f, a semiconductor device is structured to include a pad 200 formed by exposing a predetermined region of a copper line 3, which is formed on a semiconductor substrate 1. Formed on an uppermost, exposed surface of the copper line 3 is an alloy layer 5. The alloy layer 5 is formed to a predetermined thickness and by a reaction between the copper line 3 and a metal layer of a low melting point, that is, a metal layer having a melting point of 1000° C. or less. Aluminum, lead, or silver may be used as the metal having a low melting point. Also, the thickness of the alloy layer 5 is preferably less than a thickness of the copper line 3.

Silicon nitride or silicon oxy-nitride may be used as a protection layer 6. A barrier metal layer made of Ti, Ta, TiN, or TaN is formed along inner walls of a via. The barrier metal layer prevents the copper line 3 from permeating an insulation layer 2. The copper line 3 may be formed on the barrier metal layer. The barrier metal layer is preferably formed to a thickness of between 200 Å and 800 Å.

An example method for fabricating the semiconductor device according to the above-described example embodiment is described in the following with reference to FIGS. 1a through 1f. Referring first to FIG. 1a, an insulation layer 2 made of an oxidation layer is formed on a structure 1 of a semiconductor substrate, that is, on a semiconductor substrate on which individual devices are formed or on a lower metal line layer. A selective region of the insulation layer 2 is etched to form a via 100. A copper layer 3 is then formed on the insulation layer 2 and within the via 100 fully filling the same.

Before depositing the copper layer 3, a barrier metal formed of a material such as Ta, Ti, TaN, and TiN is formed on the insulation layer 2. The barrier metal is formed to a thickness between 200 and 800 Å, preferably 500 Å. The barrier metal prevents the copper layer 3 from permeating the insulation layer 2.

Next, referring to FIG. 1b, chemical mechanical polishing is performed on the copper layer 3 to flatten the same and until the insulation layer 2 is exposed, after which a cleaning process is performed. A reaction layer 4 is then formed to a predetermined thickness on the copper layer 3 and the insulation layer 2 using a physical vapor deposition process that includes sputtering method.

The reaction layer 4 is formed of a metal material having a low melting point of 1000 Å or less. Aluminum, lead, or silver may be used as this metal. The reaction layer 4 is formed to a thickness less than that of the copper layer 3 so that an alloy layer, which is formed in a subsequent step, does not exceed a predetermined thickness. Further, the reaction layer 4 is preferably deposited at a relatively low temperature of 300° C. or less.

Referring to FIG. 1c, a heat-treating process is performed such that a reaction occurs in the contacting surfaces between the copper layer 3 and the reaction layer 4 to thereby form an alloy layer 5 in this area. The portion of the alloy layer 5 formed on the copper layer 3 and that is within the via 100 is formed to a thickness that is less than that of the copper layer 3. The heat-treating process is performed at a temperature of approximately 350~450° C. and for 10 to 60 minutes, preferably for 30 minutes at 400° C.

Next, with reference to FIG. 1d, chemical mechanical polishing or anisotropic etching e.g., an etch back process) is performed until the insulation layer 2 is exposed such that the alloy layer 5 is left remaining only in the via 100 while the alloy layer 5 and the reaction layer 4 formed outside the area encompassed by The via 100 are removed. An upper surface of the alloy layer 5, therefore, is formed substantially flush with the insulation layer 2. A cleaning process is performed after chemical mechanical polishing or anisotropic etching. A heat-treating process may be performed after cleaning at a temperature of approximately 250~350° C. and for 10 to 60 minutes, preferably for 30 minutes at 300° C.

Subsequently, with reference to FIG. 1e, a protection layer 6 is formed on the alloy layer 5 and the insulation layer 2, then a photoresist is deposited on the protection layer 6. The photoresist is then exposed and developed to thereby form a photoresist pattern 7 in which an area of the photoresist where a pad will be formed is removed. Silicon nitride or silicon oxy-nitride may be used to form the protection layer 6.

With reference to FIG. 1f, the photoresist pattern 7 is used as a mask to dry etch an exposed area of the protection layer 6. Next, the photoresist pattern 7 is removed then a cleaning process is performed, thereby completing the formation of a pad 200 that exposes the alloy layer 5.

In the above processes, an opening width of the photoresist pattern 7 that determines a width of the pad 200 is preferably less than a width of the via 100. This prevents areas of the insulation layer 2 adjacent to the via from being removed when etching the protection layer 6 to form the pad 200.

In the example embodiment described above, the alloy layer is formed by a reaction between the copper line and reaction layer, effected by a heat-treating process. This is performed following the formation of the reaction layer on the copper line using a metal material having a low melting point. As a result, exposure of the copper line through the pad is prevented such that bonding defects resulting from corrosion of the copper line are minimized. This results in an improvement in the reliability of the device. The present invention is not limited in its application to only copper lines, and it is possible to find applications to lines made of other metals.

Although embodiments described herein have been described in detail hereinabove in connection with certain example embodiments, it should be understood that the invention is not limited to the disclosed example embodiments but, on the contrary, is intended to cover various modifications and/or equivalent arrangements included within the spirit and scope of the appended claims.

What is claimed is:

1. A method of fabricating a semiconductor device comprising:
    forming a via having substantially vertical sidewalls by etching a predetermined region of an insulating layer to expose a semiconductor substrate;
    filling the via with a metal to form an outermost metal line;
    forming a reaction layer on the outermost metal line and the insulating layer, wherein the reaction layer has a melting point of less than or equal to 1000° C.;
    performing a heat treatment process to react the reaction layer and the outermost metal line, thereby forming an alloy layer on a interface between the reaction layer and the outermost metal line; and
    removing an unreacted portion of the reaction layer and a first portion of the alloy layer to expose the insulating layer, such that a second portion of the alloy layer remains within the via.

2. The method of claim 1, wherein forming the reaction layer comprising a physical vapor deposition process including a sputtering method performed at a temperature of 300° C. or less.

3. The method of claim 1, wherein the heat treatment process comprises exposure to a temperature of 350 to 450° C. for a duration of 10 to 60 minutes.

4. The method of claim 1, wherein the insulation layer comprises an oxide layer.

5. The method at claim 1, further comprising an exposed metal line in the exposed semiconductor substrate.

6. The method of claim 1, wherein the reaction layer comprises a material selected from the group consisting of aluminum, lead, and silver.

7. The method of claim 6, wherein forming the reaction layer comprises depositing the selected material to a thickness that is less than a thickness of the outermost metal line.

8. The method of claim 1, wherein the outermost metal line is comprises copper.

9. The method of claim 8, further comprising forming a barrier metal layer in the via prior to forming the outermost metal line.

10. The method of claim 9, wherein the barrier metal layer comprises a metal selected from the group consisting of Ti, Ta, TiN, and TaN.

11. The method of claim 9, wherein the barrier metal layer is formed to a thickness between 200 and 800Å.

12. The method of claim 9, wherein the barrier metal covers all surfaces of the via to prevent diffusion of the copper out of the via.

13. The method of claim 12, wherein the barrier metal layer contacts the substrate.

14. The method of claim 1, further comprising the steps of:

forming a protection layer on the insulating layer and the second portion of the alloy layer; and etching an opening the protection layer to expose a predetermined region of the alloy layer.

15. The method of claim 14, wherein the protection layer comprises silicon nitride or silicon oxynitride.

16. The method of claim 14, wherein the predetermined region of the alloy layer has a width that is less than a width of the via.

17. The method of claim 14, wherein removing the reaction layer comprises an anisotropic etching process or a chemical mechanical polishing process.

18. The method of claim 14, further comprising a cleaning process performed after removing the reaction layer, and a heat treatment process performed at a temperature of 250 to 350° C. for a duration of 10 to 60 minutes after the cleaning process.

19. The method of claim 14, wherein the alloy layer is completely within the via.

20. The method of claim 19, wherein a top surface of the alloy layer is lower than a top surface of the insulation layer.

* * * * *